(12) United States Patent
Sobczynski

(10) Patent No.: US 9,653,873 B1
(45) Date of Patent: May 16, 2017

(54) SELF-LOCKING ATOMIC EMISSION LASER WITH AN INTRACAVITY ATOMIC PLASMA AS THE RESONANCE LINE SEEDER

(71) Applicant: Chemled Technologies, LLC, Orange, CT (US)

(72) Inventor: Radoslaw M. Sobczynski, Orange, CT (US)

(73) Assignee: Chemled Technologies, LLC, Orange, CT (US)

( * ) Notice: Subject to any disclaimer, the term of this patent is extended or adjusted under 35 U.S.C. 154(b) by 0 days.

(21) Appl. No.: 14/139,461

(22) Filed: Dec. 23, 2013

Related U.S. Application Data

(60) Provisional application No. 61/753,015, filed on Jan. 16, 2013.

(51) Int. Cl.
| | | |
|---|---|---|
| *H01S 5/00* | (2006.01) | |
| *H01S 3/22* | (2006.01) | |
| *H01S 3/07* | (2006.01) | |
| *H01S 5/028* | (2006.01) | |
| *H01S 5/022* | (2006.01) | |

(Continued)

(52) U.S. Cl.
CPC .............. *H01S 3/073* (2013.01); *H01S 3/097* (2013.01); *H01S 3/225* (2013.01); *H01S 3/2207* (2013.01); *H01S 5/028* (2013.01); *H01S 5/0222* (2013.01); *H01S 3/134* (2013.01)

(58) Field of Classification Search
CPC . H01S 1/06; H01S 3/03; H01S 3/0305; H01S 3/031; H01S 3/041; H01S 3/042; H01S 3/0621; H01S 3/0625; H01S 3/227; H01S 3/2366; H01S 5/028
See application file for complete search history.

(56) References Cited

U.S. PATENT DOCUMENTS

| | | | |
|---|---|---|---|
| 3,718,868 A | 2/1973 | Pao et al. | 331/94.5 |
| 3,919,664 A | 11/1975 | McAllister | 331/94.5 C |

(Continued)

OTHER PUBLICATIONS

Meyer, Y. H. ;Strong Field Effect on Intracavity Atoms in Dye Lasers: Self Frequency-Locking; Optics Communications; vol. 30, No. 1; pp. 75-78; Jul. 1979.

(Continued)

*Primary Examiner* — Yuanda Zhang
(74) *Attorney, Agent, or Firm* — Fattibene and Fattibene LL; Paul A. Fattibene

(57) ABSTRACT

An intracavity plasma solid state laser with an emission line radiation source of determined wavelength seeding a semiconductor laser gain medium providing a high power laser beam of the determined wavelength. A plasma cell generates a determined wavelength based on an atomic emission line that is received by the semiconductor laser or laser diode having a broadband output encompassing the determined wavelength received from the plasma cell. The laser diode locks on to the determined wavelength and emits a high powered laser beam of the determined wavelength. The intracavity plasma solid state laser creates a laser beam of narrow linewidth comparable to the natural Voight or Doppler linewidth of atomic transition and higher power in a smaller size than previously possible. The intracavity plasma solid state laser is easily manufactured and suitable for placement in an array for targeting a predetermined area.

22 Claims, 8 Drawing Sheets

(51) Int. Cl.
*H01S 3/097* (2006.01)
*H01S 3/225* (2006.01)
*H01S 3/134* (2006.01)

(56) References Cited

U.S. PATENT DOCUMENTS

| | | | |
|---|---|---|---|
| 4,918,704 A | 4/1990 | Caprara et al. | 372/99 |
| 4,932,030 A | 6/1990 | Chung | 372/32 |
| 5,390,203 A | 2/1995 | Miller | 372/29 |
| 5,619,517 A | 4/1997 | Dixon | 372/21 |
| 5,838,701 A | 11/1998 | Deutsch et al. | 372/10 |
| 6,643,311 B2 | 11/2003 | Krupke | 372/56 |
| 7,664,149 B2 | 2/2010 | Diels et al. | 372/25 |
| 8,268,649 B2 | 9/2012 | Vetrovec | 438/22 |
| 2003/0081644 A1 | 5/2003 | Krupke | 372/75 |
| 2003/0099272 A1* | 5/2003 | Krupke | 372/75 |
| 2005/0012984 A1* | 1/2005 | Venkateshwaran et al. | 359/333 |
| 2008/0298402 A1* | 12/2008 | Rossi et al. | 372/20 |
| 2009/0059980 A1 | 3/2009 | Braun et al. | 372/38.01 |
| 2009/0251684 A1* | 10/2009 | Arai et al. | 356/43 |
| 2012/0300198 A1* | 11/2012 | Wu | H01S 5/06258 356/149 |

OTHER PUBLICATIONS

Kroon et al; "Rabi Oscillations in the Optical pumping of a Metastable Neon Beam with a CW dye Laser"; Physical Review A; vol. 31, No. 6; pp. 3724-3732; Jun. 1985.

Johnson et al; "Self Frequency-Locking of Dye Laser Emission to the Center of an Intracvity Atomic Absorption Frequency"; Optics Communications; vol. 56, No. 4;pp. 275-278; Dec. 15, 1985.

Bagaev et al; "Nonstationary Parametric Amplification of Polychromatic Radiation Propagating in an Extended Absorbing Resonant Medium"; Optics and Spectroscopy; vol. 94, No. 1; pp. 92-98; 2003.

Han et al; "Gain and Lasing of Optically Pumped Metastable Rare Gas Atoms"; Optics Letters; vol. 37, No. 11; pp. 2157-2159; Jun. 1, 2012.

\* cited by examiner

SELF-LOCKING ATOMIC EMISSION LASER WITH AN INTRACAVITY ATOMIC PLASMA AS THE RESONANCE LINE SEEDER

RELATED APPLICATION

This application claims the benefit of U.S. Provisional Application No. 61/753,015 filed Jan. 16, 2013, which is herein incorporated by reference.

FIELD OF THE INVENTION

The present invention relates generally to lasers, and more specifically, to an atomic wavelength, self-locking solid state or semiconductor laser. More particularly, it relates to an intracavity plasma hybrid laser combining an atomic plasma discharge and a semiconductor laser gain medium in which the output light beam is coherent and radiatively coupled to the ground or metastable state of the plasma medium. Locking of the wavelength of the output radiation to the atomic line of the plasma is passively achieved.

BACKGROUND OF THE INVENTION

The concept of a hybrid lasers with an intracavity wavelength stabilizing components has been established in the prior art. A hybrid is understood as a laser consisting of one active medium of one type and a second medium, of which the state of the matter or composition is different from the first medium. Such a hybrid may provide an additional gain or loss of photons of a specific wavelength. Passive and active embodiments of such inventions exist. In early inventions, the methane gas or iodine vapor cells were used to control the lock of the wavelengths in He—Ne lasers. U.S. Pat. No. 3,718,868 is representative of such implementations.

In other embodiments, the concept was employed in detecting the Laser Induced Fluorescence (LIF) spectrum of a suitable medium in a reference cell with a wavelength tuning mechanism, for example see U.S. Pat. No. 5,390,203. Other solutions include laser wavelength control through opto-galvanic effects, which is in a feedback control loop with the laser, such as disclosed in U.S. Pat. No. 4,932,030. All of those methods require some type of an electro-optic, opto-, or servo-mechanism to tune wavelengths and lock to the atomic transition. Another method is to use the oscillator-amplifier configurations to control the wavelength as disclosed in U.S. Pat. No. 3,919,664. This occurs when the weak laser of a well-established and stable wavelength acts as an oscillator and forces the high power gain laser medium to operate at the same wavelength. The oscillator and amplifier media can be heterogeneous i.e. employing different active media. The injection seeding is one of a possibility of subsets in such lasers, such as disclosed in U.S. Pat. No. 4,918,704.

There is a need for lasers with output beams of predetermined and stable wavelengths and in resonance with atomic transitions of elements terminated in ground or metastable states. Notably, this is seen in the sodium laser used in astronomy. In general, such lasers operating at atomic fluorescence resonance wavelengths have the potential to be used in many applications such as: interferometry, metrology, optical pumping to generate THz radiation, analytical chemistry, Raman spectroscopy, fiber optics gyroscopes, plasma diagnostics and others.

For example, lasers that resonantly probe or pump ground states or metastable states of atoms in a gas phase are of particular importance for applications in analytical chemistry, atomic clocks, plasma cleaning, plasma diagnostics, artificial stars for astronomy, and pumping alkali metal atomic vapors. Wavelength tunable dye lasers (Vol. 16, No. 1, Applied Physics Letters, p. 3, January 1970) and laser diodes (Vol. 17, Issue 1, IEEE Journal of Quantum Electronics, p. 44, January 1981.) are two examples.

Lasers with intracavity, wavelength-stabilizing components have been established in the prior art. In early inventions methane gas or iodine vapor cells were used to control the lock of the wavelengths in He—Ne lasers, for example as disclosed in U.S. Pat. No. 3,718,868. However, wavelengths were not resonant (coupled to ground states) to transitions in atomic vapors. In other inventions, such as disclosed in U.S. Pat. No. 5,390,203, a wavelength tuning mechanism is used to detect the Laser Induced Fluorescence (LIF) spectrum of a suitable medium in a reference cell. Other inventions employed opto-galvanic devices, such as disclosed in U.S. Pat. No. 4,932,030, in feedback control loops. Another method utilized an oscillator-amplifier configuration is disclosed in U.S. Pat. No. 3,919,664. A weak laser of a well-established and stable wavelength acts as an oscillator and forces the high power gain laser medium to operate at the same wavelength. Injection seeding is another method of achieving wavelength locking, which is disclosed in U.S. Pat. No. 4,918,704. A simpler construction, with the lack of complex servo-loops to control wavelengths, and the low cost of components would be an obvious advantage and benefit to the optical technologies field.

In US Patent Application Publication US2009/0059980 A1 entitled "High Stability Frequency Reference Based on Self-locked Alkali-Vapor Laser" issuing to Braun et al on Mar. 5, 2009, is disclosed a VCSEL optical gain element. It uses a photonics system comprising of an optical gain element, VCSEL diode with its emission band centered at the atomic absorption band to the atomic vapor contained inside a cavity. Such a system requires a precisely engineered VCSEL with a preset and narrow optical wavelength, which imposes tight tolerances in semiconductor process to make such a chip. In addition, there is a disadvantage in that a resonator cavity length must be in an active feedback loop with secondary electronics.

One of the paths in simplifying the laser system would be to provide a sufficiently broad active gain medium, with low constraints for positioning of its gain profile in respect to desired atomic transition. Gain mediums such as a semiconductor solid state laser, a dye laser, or materials in fiber optics lasers are fit for such a purpose. In such embodiments a strong radiative coupling between spontaneous emission from a non-coherent atomic plasma source, contained inside the resonator cavity would seed the photons desired to initiate the wavelength lock. However, a phenomenon known as amplified spontaneous emission (ASE) has not been utilized in atomic lasers or turned into practical implementations. ASE plays only a parasitic role in the lasers having a high gain active medium, thus degrading wanted directional laser action, and adversely affecting wavelength stability and output power. ASE may also cause lasing in random free run mode.

There are inventions addressing these types of problems, for example, U.S. Pat. No. 8,268,649. A significant amount of theoretical and experimental work has addressed the role of Rabi oscillations in wavelength self-locking in two level atomic systems. The theoretical and experimental work of Kroon (J. P. C. Kroon, et al. in Phys. Review A Vol. 31, Number 6, June 1985, p3724) shows some level of amplification in the upper state of populated neon atoms in optical-pumping experiments. However, spontaneous decay, due to sensitivity of pumping geometries, prevented the observations of Rabi oscillations in continuous mode of operation. In the work of Bagaev (Bagaev, S. N. et al., Opt. Spectrosc. USSR 94, 2003, 1, 92-98, "An Experimental and Theoretical Study of the Two-Wave Interactions [of a probe wave and of a pumping wave] of Wide-band Multimode Laser Pulses With an Optically Dense Extended Resonant Medium"), the authors observed strong amplification of two wave pumping experiments. Neither of those two cited works led to the development of a laser device of desired self-locking characteristics.

There are other atomic emission line lasers that operate on a three level system such as disclosed in U.S. Pat. No. 6,643,311 entitled "Diode-Pumped Alkali Laser" and issuing to Krupke on Nov. 4, 2003. Therein disclosed is a laser pumped by a laser diode array, where the pumped laser gain medium comprises an atomic vapor of an alkali element buffered with a mixture of rare-gas and selected molecular gases.

None of these prior lasers provide a relatively simple and stable laser that can produce an atomic emission wavelength that is passively locked and of high power in a compact design. Therefore, the is a need for a hybrid laser of simple construction that is compact and that can provide a high powered output laser of a determined atomic emission wavelength.

SUMMARY OF THE INVENTION

The present invention is a hybrid laser providing a high power laser beam of a predetermined wavelength of an atomic emission line. More specifically, the present invention is an intracavity plasma solid state laser (IPSSL) delivering a high power laser beam of a predetermined wavelength corresponding to an atomic emission line.

A plasma discharge is used to generate radiant energy at a determined wavelength from an atomic emission line resulting from the transition of electrons between energy states. The laser of the invention has the ability to passively self-lock the wavelength to the radiative electron transition originating from the excited atoms, which are present in a resonator intracavity plasma cell. Unlike the other atomic emission line lasers that operate on a three level system, this invention permits the generation of light for with two level energy system, where the bottom energy level is at the ground or metastable state. Operation of the IPSSL requires radiation trapping in the plasma. It is further hypothesized that the formation of Rabi oscillations in the plasma lead to transparency of the plasma at the locked wavelength enabling efficient transfer of radiation from the semiconductor laser to the exit point. There is a wide tolerance of selection for the spectral width of the laser gain medium.

A plasma discharge emission resulting from a (dipole-dipole) transition of electrons between the energy states of an atomic vapor or gas is used to generate photons to seed the gain medium. The gain medium passively (i.e., without any opto-mechanical feedback control loop) self-locks to the wavelength of that plasma emission. These atomic transitions have strong propensities to trap radiation in plasmas. The present invention permits the generation of light with a two level energy system where the bottom energy level is at the ground or metastable state. Operation of the laser of the invention requires radiation trapping in the plasma. It is further hypothesized that the formation of Rabi oscillations in the plasma lead to transparency of the plasma at the locked wavelength enabling efficient transfer of radiation from the semiconductor laser to the exit point. The atomic transitions known to cause atomic radiation trapping in atomic vapors or plasmas are particularly useful.

There is a wide tolerance for the spectral width of the laser gain medium. In one embodiment of the invention a simple plasma emission source seeds the resonator cavity with photons. No dispersive or tuning elements are necessary to lock the wavelength to the center of the atomic emission line. Operation at a predetermined wavelength is stable and continuous (CW). The invention uses a suitable semiconductor laser as the active gain medium and a confined gas or vapor as the intracavity plasma source. The invention is compact by virtue of a fundamental operational principal that the output power is decoupled from the size of the laser cavity.

The invention comprises a simple plasma emission source for seeding the resonator cavity with photons does not require any dispersive or tuning elements to lock the wavelength on the center of the atomic emission line. The hybrid laser or intracavity plasma solid state laser generates laser radiation at a wavelength of an atomic emission line. It has a stable and continuous work or wave (CW) of operation at a predetermined wavelength and at high power. The invention uses a suitable semiconductor laser active gain medium with an intracavity plasma source construction of gas or vapor composition.

In another embodiment of the invention an array of intracavity plasma solid state lasers are used to provide a predetermined beam of high power.

Accordingly, it is an object of the present invention to provide a high power laser providing an output laser beam of a determined wavelength based on an atomic emission line.

It is another object of the present invention that it has a relatively simple construction and can be manufactured at relatively low cost.

It is an advantage of the present invention that it has a relatively small size and is compact.

It is another advantage of the present invention that it is scalable and can easily be assembled into an array.

It is a feature of the present invention that a narrow atomic emission line of an atomic plasma discharge determines the precise wavelength of the output laser beam.

It is another feature of the present invention that a semiconductor laser gain medium or laser diode is used as a high gain medium to lock onto the atomic emission line of the plasma discharge and to amplify the corresponding radiant power.

It is yet another feature of the present invention that atomic vapors that exhibit radiation trapping are used.

These and other objects, advantages, and features will become readily apparent in view of the following more detailed description.

BRIEF DESCRIPTION OF THE DRAWINGS

FIG. 3C is a graph of the spectra at a semiconductor laser diode temperature of T=290 K thus encouraging self-lock to the 640.22 nm wavelength.

DETAILED DESCRIPTION OF THE PREFERRED EMBODIMENT

The following detailed description is of currently the best contemplated modes of carrying out the exemplary embodiments of the invention. The description is not to be taken in a limiting sense, but is made merely for the purpose of illustrating the general principles of the invention, since the scope of the invention is best defined by the appended claims. Various inventive features are described below that can each be used independently of one another or in combination with other features. However, any single inventive feature may not address all the problems discussed above or may only address one of the problems discussed above. Further, one or more of the problems discussed may not be fully addressed by any of the features described below.

Figure 1:
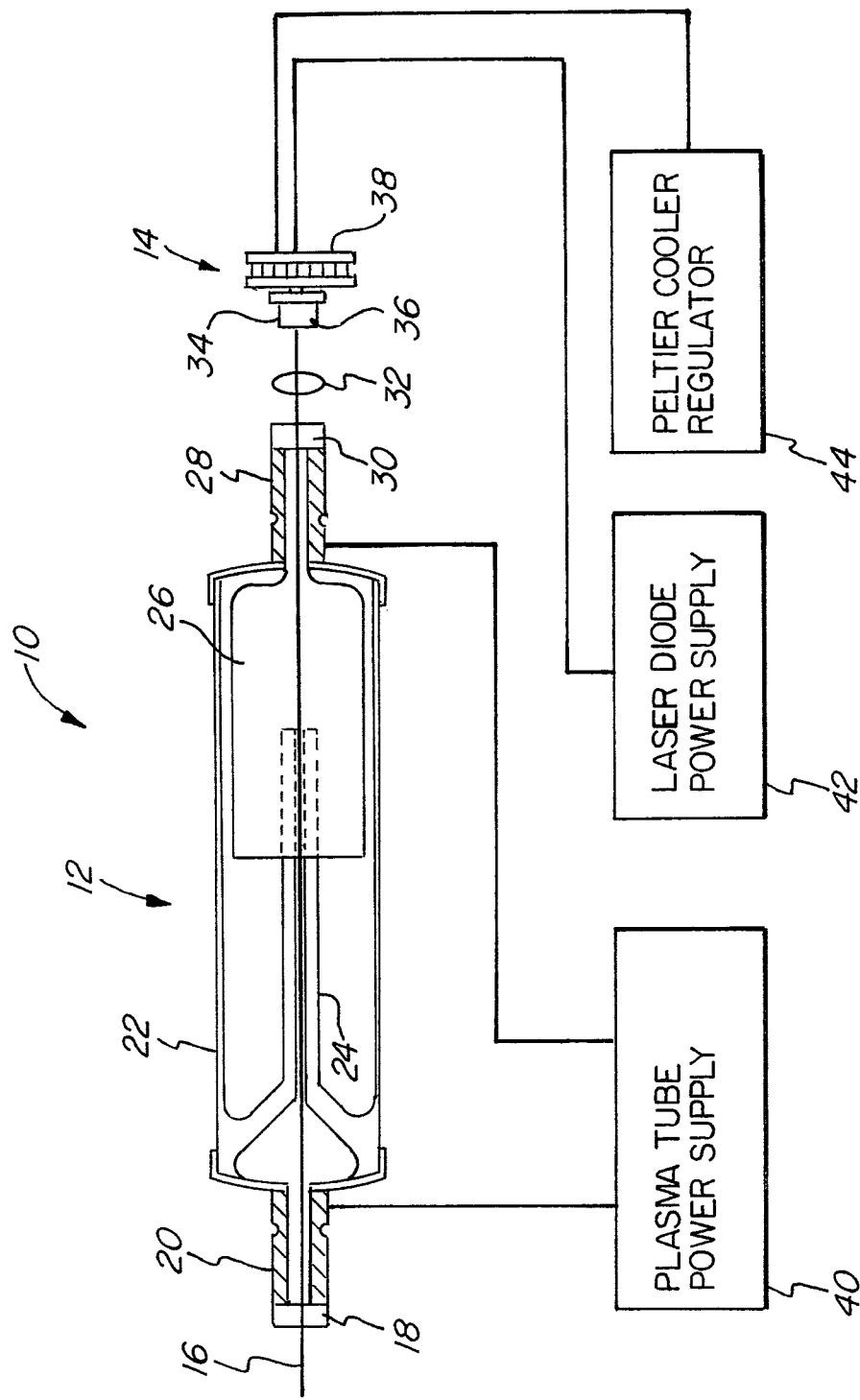
FIG. 1 schematically illustrates the present invention with intracavity plasma cell and semiconductor laser gain medium or laser diode.

An embodiment of the present invention is exhibited in the components shown in FIG. 1. The hybrid laser for 633.44 and 640.22 nm wavelength emission lines consist of a capillary discharge plasma cell 12, which contains high purity neon gas, pure or diluted by helium, or other buffer gas which may be another rare-gas, in proportion for yielding the best spontaneous emission intensity on selected emission lines of interest. By doing so, the cost of constructing a high performance atomic laser is reduced. The fill up pressure is low and at a few Torr, again to obtain the best discharge conditions for the suited purpose. Typically the dilution ratio of neon is in the range of 4:1 up to 14:1. The capillary tube 24, having a small bore of 1 mm in diameter is axially aligned with the main optical axis. The discharge plasma cell or tube 12 is fitted with a dielectric coated partially reflective output mirror 18, on one end and a glass window 30, on the other end. The electric high voltage of 1.5 kV and 4 mA current from a power supply module or plasma tube power supply 40 is connected to anode 20, which is a small cylindrical metal electrode and cathode 28, which is also a small cylindrical metal electrode. In addition, the cathode 28 is in electrical contact with the large cylindrical can 26, extending through half the length of the tube or tubular housing 22. The length of the capillary tube 24 is 15 cm; however its length has not been fully optimized in the presented embodiment. It is expected that the optimal length can be shortened to just a few centimeters. Thus, the overall distance from dielectric output mirror 18, to glass window 30, which is currently 25 cm, upon shortening, will lead to a more compact design. The tube is commercially available from Melles-Griot company model number 05-WHR570, however other manufacturers can provide similar tubes or discharge cells. For the purpose of generating other wavelengths the plasma cell 12 can be filled with other gases or metal vapors for the desired result, such as helium, neon, argon, krypton, xenon, alkali metals such as lithium, sodium, potassium, rubidium, cesium, magnesium, calcium, strontium, mercury or other elements with strong atomic radiation trapping and suitable solid state photonic gain medium.

Dielectric coating of the output mirror 18 should also match the desired wavelength range. In the optical train, there is an aspheric collimating lens 32, that was manufactured by Thorlabs, Inc. and which has a high numerical aperture of 0.55 and a broadband anti-reflection coating. As the high gain active medium, semiconductor laser gain medium, or laser diode 34 the hybrid laser system used laser diode 34 from Hitachi, model HL6312G, with a facet 36 coated with an antireflection coating provided by Laser Optics, Inc. The anti-reflection coating prevents any laser action inside the laser diode 34 and has been enabled to extend the resonator cavity and uses the dielectric output partially reflective mirror 18 as the output coupler. The laser diode 34 was powered by a laser diode variable power supply 42 at 45-70 mA. The laser diode 38 is in thermal contact with a Peltier cooler 44, which was obtained from Melcor Corp. and powered by a HTC3000 temperature controller module or cooler regulator 44, from Wavelength Electronics, Corp. Those skilled in the field may recognize that the use of a temperature or cooler regulator 44 and Peltier cooler 38 might be avoided when the solid state or semiconductor active gain medium of the component or laser diode 34, has a good spectral match to the desired wavelength. Also it is important to mention that optically pumped solid state crystals, fiber optics lasers, or dye lasers may be good candidates for hybrid lasers operating on the disclosed principles.

Essentially, as illustrated in FIG. 1, the present invention of a hybrid laser or intracavity plasma solid state laser (IPSSL) 10 comprising a plasma cell 12 and a semiconductor laser gain medium or laser diode assembly 14. The plasma cell 12 may be any emission line radiation source that generates an emission line resulting from an electron transitioning between discrete energy levels resulting in light or photon of a specific or determined wavelength. The electron transitioning is to a ground or a metastable state. The plasma cell 12 comprises a tubular housing 22 containing a capillary tube 24 and a cylindrical can 26. The tubular housing 22 is made of glass and the cylindrical can 26 of metal. The cylindrical can 26 is in electrical contact with a cathode 28. Adjacent the cathode 28 is a glass window 30. At the other end of the plasma cell 12 is anode 20. Adjacent the anode 20 is a dielectric partially reflective output mirror 18. The output laser beam 16 passes through the output mirror 18. Adjacent the window 30 is a collimating lens 32. The collimating lens 32 is adjacent the laser diode assembly 14. The laser diode assembly 14 comprises a laser diode 34 having a facet 36 with an anti-reflective coating. Adjacent the laser diode 34 is a cooler 38 for controlling the temperature of the laser diode 34. The cooler 38 may be a Peltier cooler or thermoelectric cooler, or other cooling device. The cooler 28 is controlled by a regulator 44. The laser diode 34 is a semiconductor laser gain medium that acts as an amplifier. The plasma cell 12 is powered by a plasma tube power supply 40 connected to the anode 20 and the cathode 28. The laser diode 34 is powered by a laser diode power supply 42.

In operation, upon energizing the plasma cell 12 an emission line with a determined or characteristic wavelength is generated in the plasma cell 12 and emitted from the window 30. The emission line and determined wavelength is determined by the composition of the materials within the plasma cell. The materials may be adjusted to provide a predetermined wavelength based on the emission line. The electromagnetic radiation generated by the plasma cell 12 enters the laser diode 34 through the facet 36. The laser diode 34 locks on to the determined wavelength of the electromagnetic radiation from the plasma cell 12 and generates a higher power laser beam of the determined wavelength of the emission line. The laser beam from the laser diode 34 passes through the plasma cell 12 and exits through the output mirror 18 as output laser beam 16. The output laser beam 16 has a substantially higher power than the electromagnetic radiation from the plasma cell 12 and has the determined wavelength based on the emission line. The output laser beam 16 may have a power greater than 100 mw.

In essence the electromagnetic radiation from the spontaneous emission from the plasma cell 12 seeds the laser diode 34 creating a stimulated emission of the desired wavelength at higher power. The hybrid laser or intracavity plasma solid state laser (IPSSL) 10 of the present invention combines the power of the laser diode 34 with the narrow line width of the plasma cell 12 atomic emission line to provide a high power output laser beam 16 with the narrow line width of the emission line of the atomic transition of the material within the plasma cell 12. This makes possible a compact relatively high power laser with narrow line width that is suitable for fabrication in an array for high power applications in a physically small space.

Figure 2A:
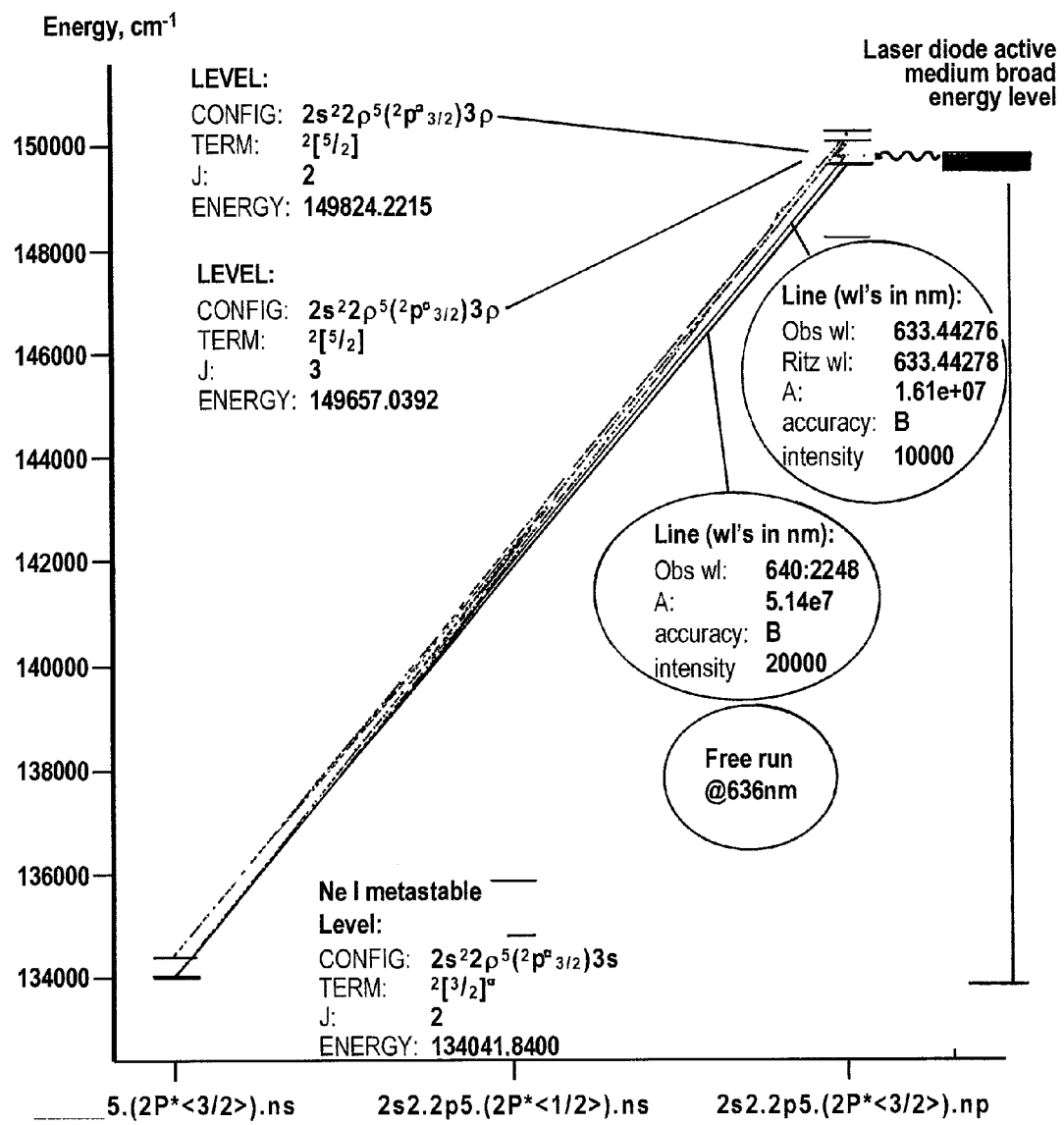
FIG. 2A is an energy level graph of radiative transitions illustrating the atomic emission line responsible for seeding the semiconductor laser gain medium or laser diode in the laser of the present invention.

FIG. 2A is a graph illustrating the emission line energy levels of Neon(I) on which an embodiment of the hybrid laser or intracavity plasma solid state laser (IPSSL) 10 of the present invention operates. The wavelength of the emission lines of the plasma cell in this embodiment are 633.442 nm and 640.225 nm.

Figure 2B:
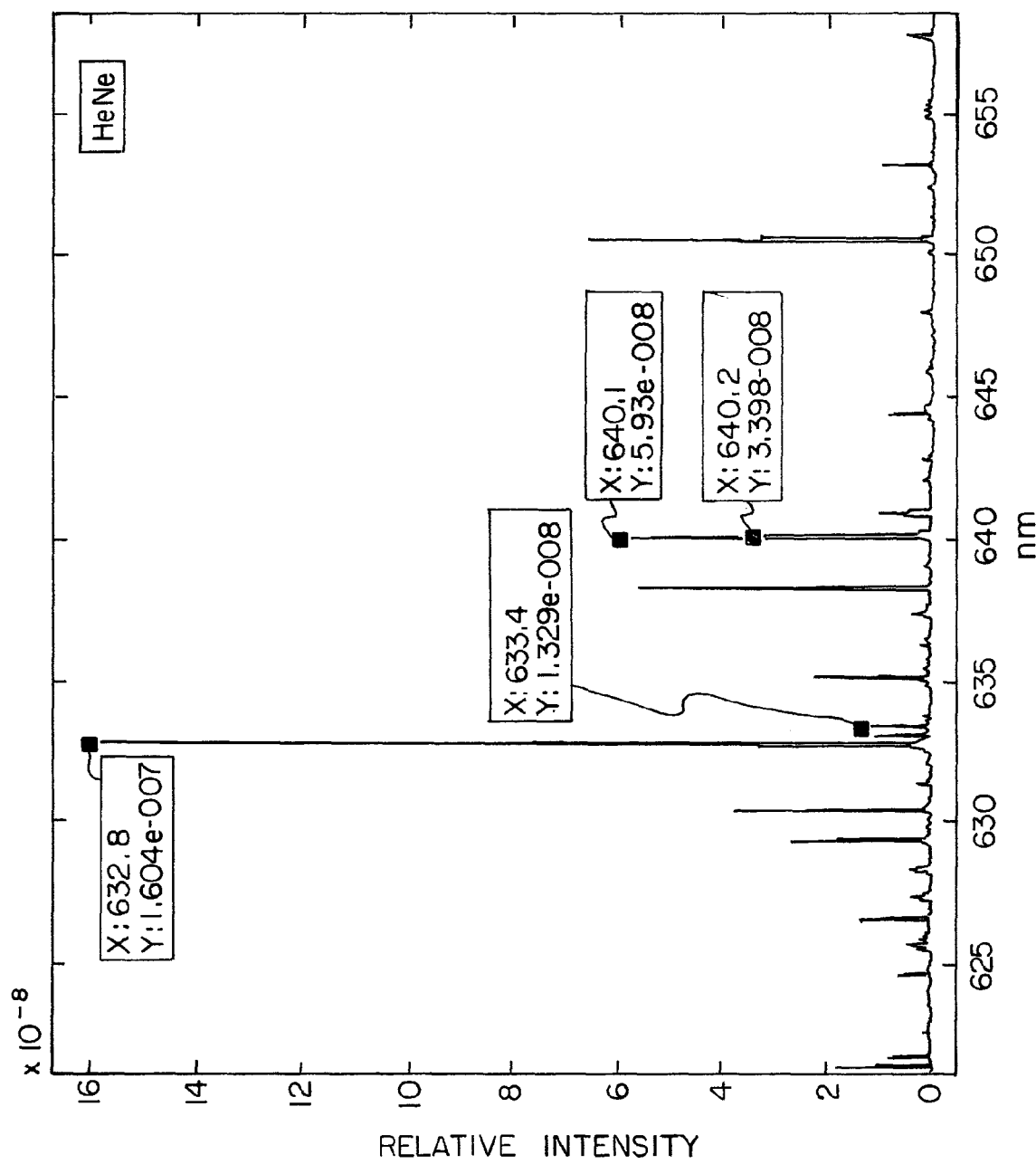
FIG. 2B is a graph illustrating several spectral lines in the spectrum of a HeNe plasma source.

FIG. 2B is a graph illustrating several spectral lines in the spectrum of a HeNe plasma source. For example, spectral lines at wavelengths of 632.8 nm, 633.4 nm, 640.1, and 640.2 are illustrated.

Figure 3A:
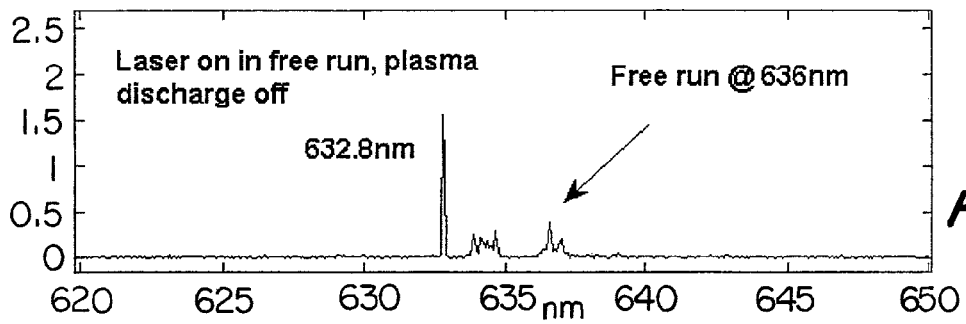
FIGS. 3A-D are graphs of experimental observations of output laser beam wavelength at various combinations of control parameters and their effect on laser wavelength.
Figure 3B:
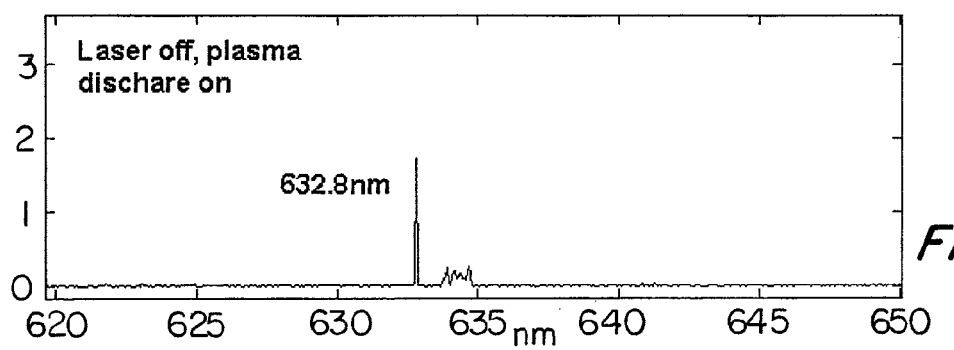
Figure 3C:
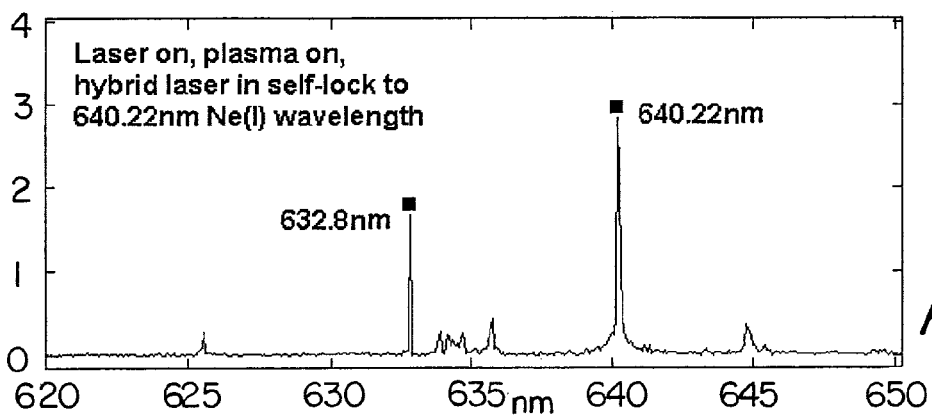
Figure 3D:
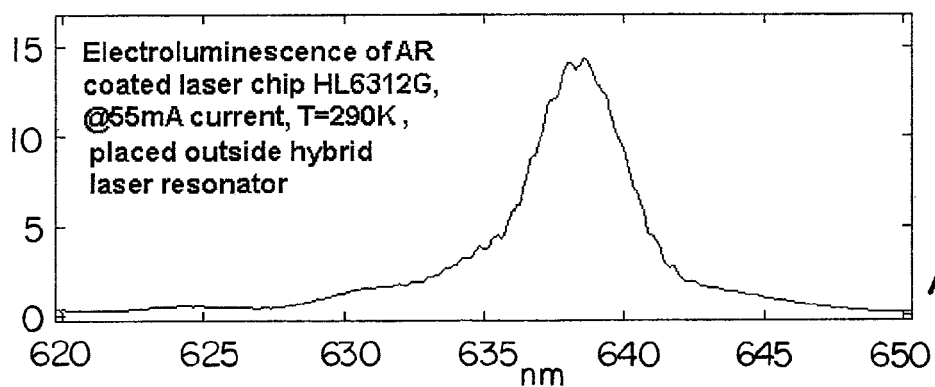

FIGS. 3A-D are graphs of spectra recorded by means of a scanning Michelson interferometer capable of resolving spectral lines at 1 cm$^{-1}$ resolution. The Y-axis is relative intensity. The 632.8 nm line visible on spectra originates from the internal reference laser inside the interferometer. FIG. 3A, the top spectrum, shows the laser in free run, where the plasma discharge was off. FIG. 3B shows the spectrum of a very faint radiation from the plasma cell 12 discharge tube in the absence of radiation from the semiconductor laser or laser diode. FIG. 3C shows the laser radiation from the hybrid laser 12 of the invitation when the plasma cell 12 discharge and laser diode 34 are turned on at a laser diode temperature of 290 K. The self-locked wavelength of the radiation at 640.22 nm, Neon(I) line, is clearly visible. FIG. 3D is spectra of a broad electroluminescence of the laser diode 34 after removal of the output mirror 18. This profile is temperature dependent and by lowering the operating temperature of the semiconductor laser or laser diode 34 the maximum of the gain curve shifts toward the shorter wavelengths. At such conditions the laser field couples with the 633.44 nm emission line, as illustrated in FIG. 4. That is, the emission line wavelength on which the laser diode 34 locks is temperature dependent. FIG. 3C is a graph showing an output laser beam wavelength of 640.22 nm when the laser diode 34 is at a temperature of 290 K.

Figure 4A:
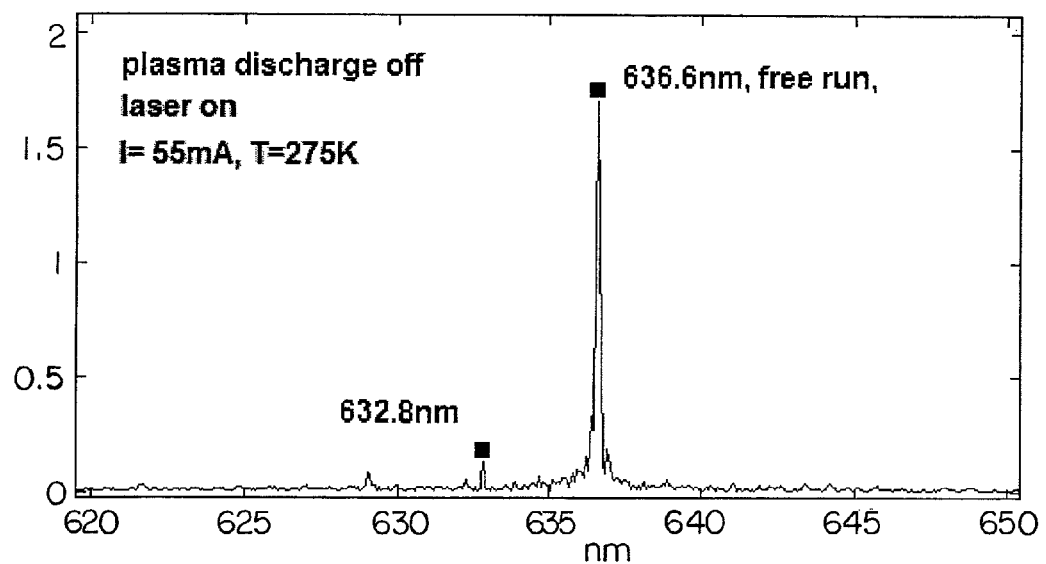
FIGS. 4A-B are graphs of experimental observations of output laser beam wavelength at a semiconductor laser diode temperature of T=275 K, with FIG. 4A illustrating the spectra with the plasma cell discharge off and FIG. 4B illustrating the spectra with the plasma discharge on thus encouraging self-lock to the 633.44 nm.
Figure 4B:
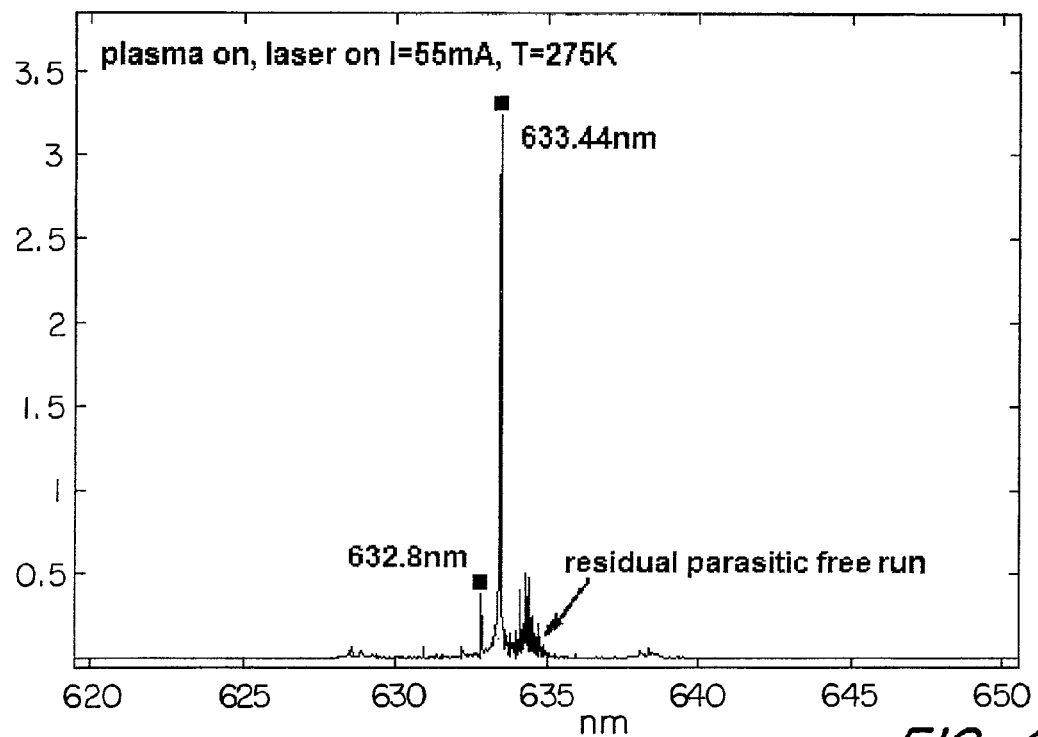
Figure 5A:
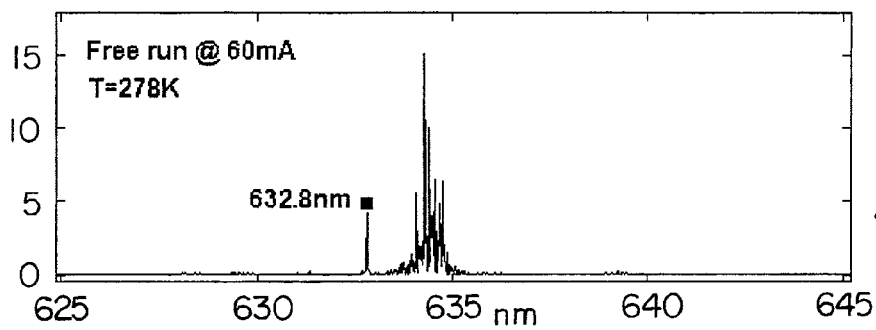
FIGS. 5A-D are graphs of output laser beam wavelength insensitivity during self-lock operation at various semiconductor laser diode currents.
Figure 5B:
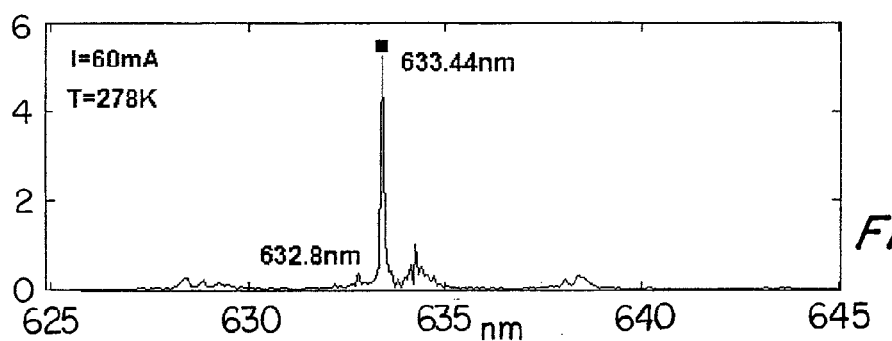
Figure 5C:
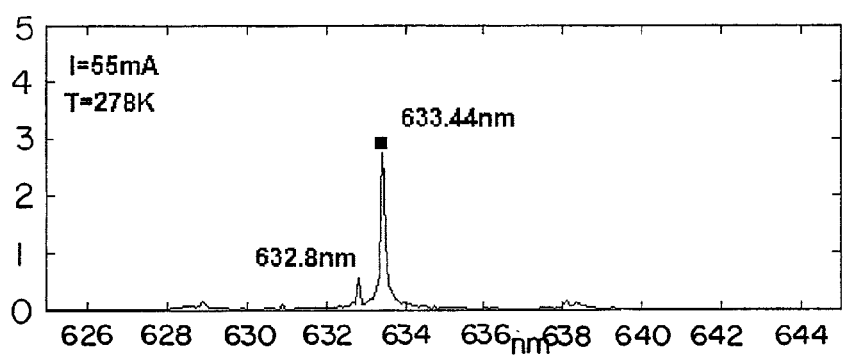
Figure 5D:
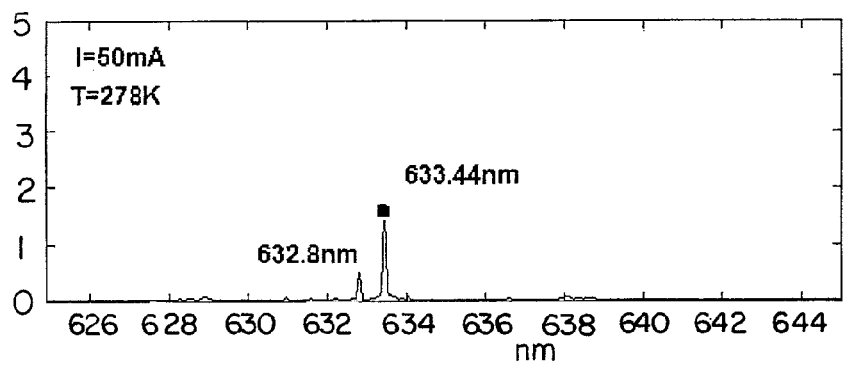

FIG. 4A, the top spectrum, shows the semiconductor laser diode 34 in its free multimode run in the absence of any plasma emission from the plasma cell 12. In FIG. 4A the Y-axis is relative intensity. The temperature of the semiconductor laser diode was lowered to 275 K to better match its active gain curve with the location of the 633.44 nm wavelength emission line. FIG. 43 shows the self-lock of the laser field to the 633.44 nm, Ne(I), atomic emission line transition. In FIG. 43 the Y-axis is relative intensity. FIG. 43 is a graph showing an output laser beam wavelength of 633.44 nm when the laser diode 34 is at a temperature of 275 K. The 632.8 nm lines on both graphs in FIGS. 4A-3 belong to the radiation of the internal laser in the Michelson interferometer and are not associated or needed for operation of the intracavity plasma solid state laser (IPSSL) 10. Observed artifact echo signals at 629 nm and 638 nm are inherent to some parasitic reflections inside that Michelson interferometer and can be explained by cepstral analysis of the interferrogram. Again this is an artifact associated with the wavelength-measuring instrument or Michelson interferometer.

FIGS. 5A-D are graphs of sets of experimental spectra illustrating laser wavelength insensitivity during self-lock operation and at various laser diode 34 currents. As can be seen in the graphs in FIGS. 5A-D, the power or intensity of output laser beam 16 is dependent on laser diode 34 driving current. In FIGS. 5A-D the Y-axis is relative intensity.

Two optical processes relevant to the understanding of the current invention are amplified spontaneous emission (ASE) and radiation trapping. ASE is the amplification in a (usually high) gain medium of spontaneous emission. It is generally associated with mechanisms that degrade performance, and has not actually been utilized as the basis for a practical laser device.

Radiation trapping (is the repeated absorption and re-emission of a photon of the same energy, corresponding to a transition between the same upper and lower energy states, in an excited atomic vapor before the radiation reaches the boundary of the container. See, Molisch, Andreas F.; Oehry, Bernard P. (1998), *Radiation Trapping in Atomic Vapours*, Oxford: Oxford University Press, ISBN 0-19-853866-9).

Criteria for radiation trapping include the following: (1) transition must be dipole-dipole; (2) oscillator strength must be high; (3) the branching ratio of the transition must be close to 1, statistically enhancing the trapping probability and reducing the probability of competing energy transfer paths; (4) the concentration of the lower state must be sufficient, typically greater than $10^{10}$ cm$^{-3}$. The phenomenon is well known, and plays an important role in spectroscopy, gas lasers, atomic line filters, and in determining the dynamics of atomic interactions. For example, the mechanism determines the efficiency of a three-level gas laser, such as ionic lasers. Atoms are excited from the ground state to an upper state, where they decay to a middle state. If the lifetime of the middle state is shorter than that of the upper state, population inversion occurs between the upper and the middle states, and the gas becomes amplifying. As the relative lifetime of the middle state with respect to the upper state increases, photons become trapped in the middle state decreasing the population inversion of the upper state. Just a few percentage change in the population of the middle state can switch the system from amplification to attenuation. Atoms known to promote radiation trapping include Group I or 1, II or 2, and VIII or 8 of the Periodic table of elements, and mercury.

Of particular interest are the elements that result in the atomic emission lines having the following wavelengths, Hg 253.652 nm, Hg 404.656 nm, Ca 422.67, Ca 657.278, Li 670.76 nm, Li 670.79 nm, Ne 633.44 nm, Ne 640.22 nm, He 1083 nm, Ar 763.51 nm, Rb 780.03, Rb 794.76 nm, Ar 801.47 nm, Kr 760.15 nm, and Xe 823.16 nm.

It should be understood, of course, that the foregoing presentation of the laser of the present invention relates to exemplary embodiments of the invention and that modifications may be made without departing from the spirit and scope of the invention as set forth in the following claims. As an example, if rubidium is used with the plasma cell 12 a spontaneous emission line at 780.03 nm will be generated to seed the laser diode 34. The laser diode 34 or semiconductor laser gain medium would generally be selected to provide a gain for the selected emission line. That is, the laser diode selected would, without seeding by the electromagnetic radiation of a wavelength of an emission line, generally provide laser radiation in a broad spectrum around the wavelength of the selected emission line.

Figure 6:
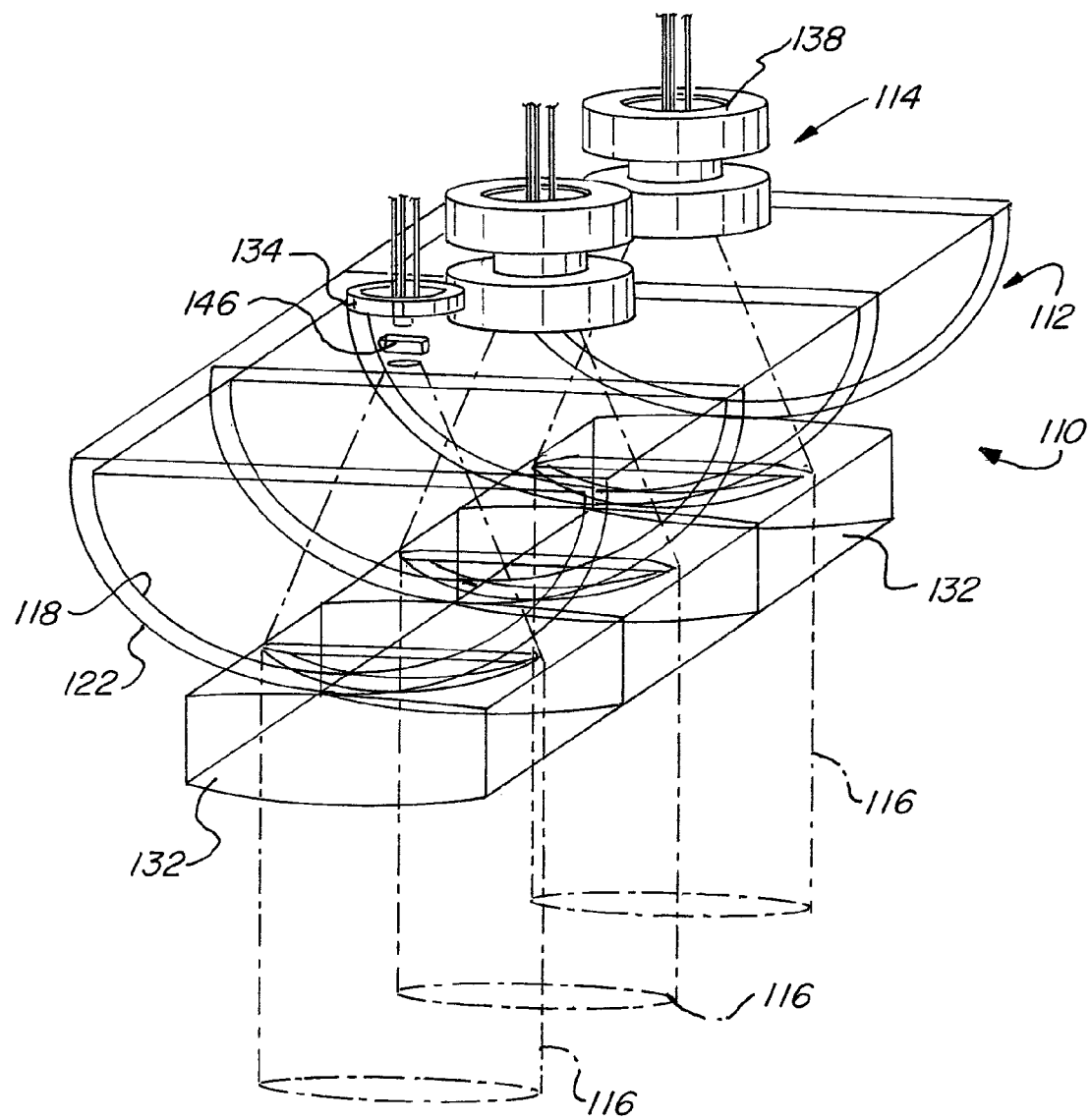
FIG. 6 is a perspective view of an array of lasers of another embodiment of the present invention.
Figure 7:
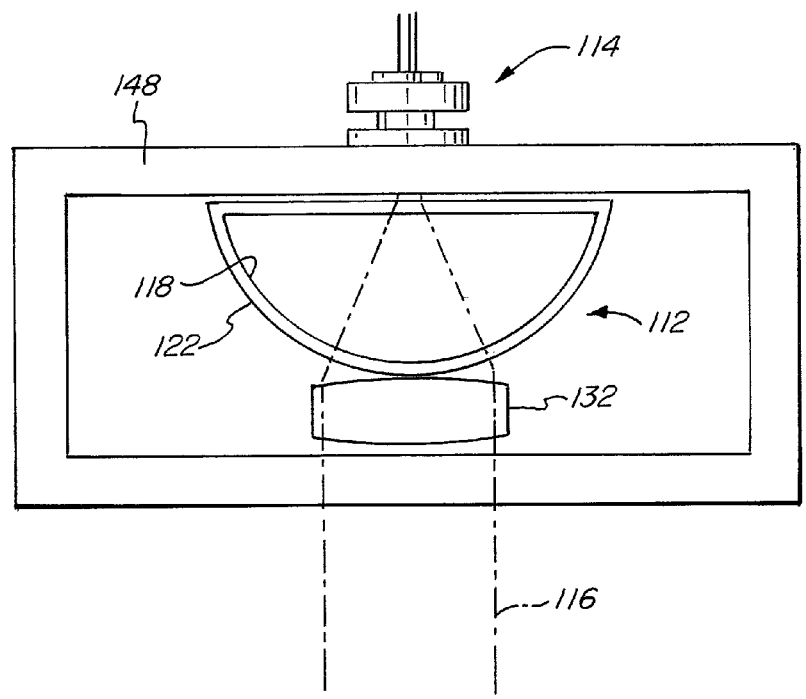
FIG. 7 schematically illustrates one of the lasers illustrated in FIG. 6.

FIGS. 6 and 7 illustrate another embodiment of the present invention. In this embodiment of the present invention a plurality of intracavity plasma solid state lasers are arranged in an array.

FIG. 6 is a schematic perspective view illustrating an intracavity plasma solid state laser array 110. The laser array 110 comprises a plurality of plasma cells 112 having a D-shape. A semiconductor laser assembly 114 is placed adjacent to the planar surface of the plasma cells 112. Laser beams 116 of coherent light and determined wavelength are emitted. The laser beams 116 may be collimated or shaped by collimating lenses 132 placed adjacent the plasma cells 112. The collimating lenses 132 may be toroidal. The laser beams 116 may be shaped or formed so as to have a slow and a fast axis. A cylindrical lens 146 placed between the plasma cells 112 and the laser diode 134 may be used to compensate beam geometry and collimate the slow axis. The plasma cells 116 have a dielectric coating on the semi-cylindrical surface providing a semi-reflective or partially reflective surface. This partially reflective semi-cylindrical surface acts as an output coupler mirror for the plasma cell 112 to function as a laser cavity. The laser beam 116 exits the plasma cell 112 through the partially reflective semi-cylindrical surface of the plasma cells 112. The laser beam exits the plasma cells 112 through the semi-cylindrical surface. A cooler 138 regulates the temperature of the laser diode 134.

FIG. 7 is a cross section schematically illustrating the embodiment of the present invention illustrated in FIG. 6 placed in a microwave waveguide 148. In FIG. 7, the microwave waveguide 148 may be used to energize the plasma cell 112. The microwave waveguide 148 may be a T-coupler. In this embodiment, the laser beams 116 may be shaped to have a fast and slow axis.

The intracavity plasma solid state laser of the present invention makes possible a relatively high power laser beam of a determined narrow wavelength in a compact package. The determined narrow wavelength is based on an emission line from stimulated emission occurring in the plasma cell and is dependent upon the atomic material in the plasma cell. The material in the plasma cell may be any material providing an emission line at a ground or metastable state for a wavelength of interest. The material in the plasma should have an affinity for radiation trapping, that is to trap radiation by providing radiation that is emitted by one atom and absorbed by another. Such material may be neon, or an alkali metal such as lithium, sodium, potassium, rubidium, cesium, or other element. This determined narrow wavelength from the plasma cell seeds the semiconductor laser gain medium amplifying the determined narrow wavelength within the semiconductor laser gain medium providing a higher power output laser beam having the determined narrow wavelength. This makes practical the formation of arrays of intracavity plasma solid state lasers and their positioning to direct the output laser beams onto a targeted predetermined area. Therefore, the present invention can be applied to may useful applications needing high laser power in a small area.

Embodiments of this invention are directed to a class lasers with atomic line emissions. With this invention, the need for optical tuning components is eliminated. In one aspect of the present invention there is a laser resonator with an intracavity capillary plasma discharge of neon, a high reflector mirror, an aspheric collimating lens, and a semiconductor laser diode with an anti-reflection coated facet in thermal contact with the thermoelectric cooler on the other end.

The spectrum of a typical plasma exhibits several lines. For illustration, the spectrum of the HeNe plasma used in this work is presented in FIG. 2B. The gain curve of the semiconductor laser broadly overlaps the range from about 631 to 641 nm. A number of lines are present in this range. Operation of the intracavity plasma solid state laser of the invention requires radiation trapping to enable coupling of the output of the semiconductor laser gain medium with the plasma. Only two of the available transitions support radiation trapping, the Neon(I), 1s5-2p8 633.44 nm and 1s5-2p9 640.22 nm transitions. While the plasma discharge is off, the laser operates in free run at 636 nm. As soon as the capillary plasma is generated, the spontaneous emission of the Neon lines seed the laser action in the laser resonator.

The intracavity plasma solid state laser of the invention can operate at either wavelength or both. Using imprecise temperature control (an estimated temperature tolerance of about 10 degrees Centigrade), either single mode or bimodal operation is obtained, with the lower wavelength observed at the lower temperature, and both wavelengths observed at an intermediate temperature.

It is emphasized that if amplified spontaneous emission (ASE) played a role in the function of the invention, the predominant 632.8 line would be selected over the 633.44 line. It is not selected because radiation trapping is not supported.

It is also emphasized that the plasma is transparent to the locked wavelength. It is hypothesized that radiation generated by the gain medium may be in Rabi resonance with atoms in the plasma. The resonance creates a mix between the bottom state and the upper state such that the population probability is fifty percent for each. As a result, the radiation generated by the gain medium passes through the plasma with no gain or attenuation. However, such oscillations are difficult to detect, and may not be fully developed, if at all.

That is, the semiconductor laser active gain curve broadly overlaps with the Neon(I), 1s5-2p8 633.44 nm and 1s5-2p9 640.22 nm transitions. Either one of the spectral lines or both together can induce laser action in the intracavity plasma solid state laser. While the plasma discharge is off, the laser operates in free run at 636 nm. As soon as the capillary plasma is generated, the spontaneous emission of the Neon lines seed the laser action in the laser resonator. A working hypothesis is that radiation from the gain medium may be in Rabi resonance with atoms in the plasma. However, such oscillations are difficult to detect, and may not be fully developed, if at all. However, conditions within the plasma, including the optical density, must allow radiation trapping. The intracavity plasma solid state laser could operate at either 633.44 nm, 640.22 nm, or both. It was found that relatively imprecise temperature control of the laser was required to select one of these three modes of operation. As the input current of a laser generally affects operating temperature, the output wavelength of the intracavity plasma solid state laser is stable, and is insensitive to a broad range of supply current passing through the laser diode. The well-known 640.107 nm line of He—Ne gas lasers is not generated by the intracavity plasma solid state laser because the emission (3s2>2p2) is not radiatively trapped.

There is no known prior continuously working or wave (CW) laser operating at either 633.44 nm or 640.22 nm that is based on passive self-locking of either a semiconductor laser or any other broadband solid state laser to a spontaneous atomic line emission of a neon plasma.

The prime function of the intracavity plasma solid state laser is the generation of coherent light having a precise (atomic transition corresponding to the plasma composition) wavelength and realized through the aforementioned self-locking mechanism without additional tuning of any kind. However, a refining option that permits the cavity length adjustment or a tuning of the cavity mode within the atomic line profile is not excluded.

While the present invention has been described with respect to several different embodiments, it will be obvious that various modifications may be made without departing from the spirit and scope of this invention.

What is claimed is:

1. An intracavity plasma solid state laser comprising:
    an emission line radiation source emitting a seeding beam of a determined wavelength; and
    a semiconductor laser gain medium having a gain of the determined wavelength receiving the seeding beam from said emission line radiation source and emitting an output laser beam of higher power than the seeding beam of said emission line radiation source, the output laser beam having the same wavelength as the determined wavelength of said emission line radiation source,
    whereby said intracavity plasma solid state laser provides the output laser beam of higher power than the seeding beam at the determined wavelength.

2. An intracavity plasma solid state laser as in claim 1 wherein:
    said emission line radiation source originates from an upper exited state and is terminated at either a metastable state or ground state of an atomic gas or vapor.

3. An intracavity plasma solid state laser as in claim 1 wherein:
    said emission line radiation source is from an atomic or ionic vapor or gas material trapping electromagnetic dipole-dipole radiation originating from relevant atomic or ionic transition.

4. An intracavity plasma solid state laser as in claim 1 further comprising:
    a collimating lens placed between said emission line radiation source and said semiconductor laser gain medium.

5. An intracavity plasma solid state laser as comprising:
    an emission line radiation source comprising a plasma cell emitting a seeding beam of a determined wavelength; and
    a semiconductor laser gain medium receiving the seeding beam from said emission line radiation source,
    whereby said intracavity plasma solid state laser provides an output laser beam of higher power than the seeding beam at the determined wavelength.

6. An intracavity plasma solid state laser as in claim 5 wherein:
    said plasma cell is filed with vapors of atoms and a buffer gas.

7. An intracavity plasma solid state laser as in claim 5 wherein:
    said plasma cell is filed with vapors of atoms selected from the group consisting of elements contained in Groups I, II, VIII and mercury of the Periodic table.

8. An intracavity plasma solid state laser as in claim 5 further comprising:
    an anti-reflective coating placed on an end facet of said semiconductor laser gain medium.

9. An intracavity plasma solid state laser as in claim 5 wherein:
    said semiconductor laser gain medium comprises a laser diode with an anti-reflective facet.

10. An intracavity plasma solid state laser as in claim 5 further comprising:
    a variable power supply coupled to said semiconductor laser gain medium, whereby a current provided to said semiconductor laser gain medium may be varied.

11. An intracavity plasma solid state laser as in claim 5 wherein:
    the determined wavelength is selected from the group consisting of Hg 253.652 nm, Hg 404.656 nm, Ca 422.67, Ca 657.278, Li 670.76 nm, Li 670.79 nm, Ne 633.44 nm, Ne 640.22 nm, He 1083 nm, Ar 763.51 nm, Rb 780.03, Rb 794.76 nm, Ar 801.47 nm, Kr 760.15 nm, and Xe 823.16 nm.

12. An intracavity plasma solid state laser comprising:
    a plasma cell containing an atomic vapor demonstrating radiation trapping, whereby a seeding beam of a determined atomic wavelength is emitted; and
    a semiconductor laser gain medium receiving the seeding beam from said emission line radiation source, wherein said semiconductor laser gain medium has a gain range that encompasses the determined atomic wavelength,
    whereby said intracavity plasma solid state laser provides an output laser beam of higher power than the seeding beam at the determined wavelength.

13. An intracavity plasma solid state laser as in claim 12 further comprising:
    a temperature regulator coupled to said semiconductor laser gain medium, whereby the temperature of said semiconductor laser gain medium is controlled for selecting the determined atomic wavelength.

14. An intracavity plasma solid state laser as in claim 12 wherein:
    the atomic vapor comprises an element selected from the group consisting of elements contained in Groups I, II, and VIII and mercury of the Periodic table.

15. An intracavity plasma solid state laser providing an output laser beam of a determined wavelength comprising:
    a plasma cell providing electromagnetic radiation at an atomic resonance line wavelength from an energy level transition terminating at either a ground or metastable state, whereby a seeding beam of the determined wavelength is generated;
    a dielectric output mirror comprising a partially reflective coating placed adjacent said plasma cell, whereby the laser beam of the determined wavelength is emitted,
    a semiconductor laser gain medium having a spectrum output range encompassing the determined wavelength;

a facet having an anti-reflection coating placed on said semiconductor laser gain medium and positioned to receive the determined wavelength from said plasma cell;

a cooler regulator coupled to said semiconductor laser gain medium, whereby said semiconductor laser gain medium is maintained at a predetermined temperature;

a plasma cell power supply coupled to said plasma cell, whereby said plasma cell is powered generating the seeding beam of the determined wavelength of the atomic emission line; and a semiconductor laser gain medium power supply, whereby said semiconductor laser gain medium is powered, whereby said intracavity plasma solid state laser provides the output laser beam of higher power than the seeding beam of the determined wavelength.

16. An intracavity plasma solid state laser providing an output laser beam of a determined wavelength as in claim 15 wherein:

said semiconductor laser gain medium comprises a laser diode.

17. An intracavity plasma solid state laser providing an output laser beam of a determined wavelength as in claim 15 wherein:

said plasma cell comprises a D-shaped tube having a planar surface and a semi-cylindrical surface, wherein said dielectric output mirror is formed on the semi-cylindrical surface and said semiconductor laser gain medium is placed adjacent the planar surface of the D-shaped tube, whereby the seeding beam is directed onto said facet of said semiconductor laser gain medium.

18. An intracavity plasma solid state laser providing an output laser beam of a determined wavelength as in claim 15 further comprising:

a plurality of hybrid lasers placed in an array.

19. An intracavity plasma solid state laser providing an output laser beam of a determined wavelength as in claim 18 wherein:

the array is directed at a predetermined location.

20. An intracavity plasma solid state laser providing an output laser beam of a determined wavelength as in claim 15 wherein:

the atomic emission line is based on rubidium and the determined wavelength is substantially 780 nm.

21. An intracavity plasma solid state laser laser providing an output laser beam of a determined wavelength as in claim 15 wherein:

said cooler regulator has a temperature range sufficient to cause the determined wavelength to be a wavelength of a selected emission line.

22. An intracavity plasma solid state laser comprising:

a plasma cell containing a gas, a plasma capillary tube within said plasma cell, wherein said plasma capillary tube emits a seeding beam emission line radiation having a predetermined wavelength; and a semiconductor laser gain medium having a gain range overlapping the predetermined wavelength of the seeding beam emission line radiation emitted by said plasma capillary tube and positioned to receive the seeding beam emission line radiation, wherein radiation trapping enables coupling and locking of said semiconductor laser gain medium onto the predetermined wavelength of the seeding beam emission line radiation generating an output laser beam of the predetermined wavelength, whereby the output laser beam has the predetermined wavelength at higher power.

* * * * *